United States Patent
Ebara

(10) Patent No.: US 8,796,393 B2
(45) Date of Patent: Aug. 5, 2014

(54) PRODUCTION METHOD OF POLYHYDROXYIMIDE AND POSITIVE PHOTOSENSITIVE RESIN COMPOSITION CONTAINING POLYHYDROXYIMIDE OBTAINED BY THE PRODUCTION METHOD

(71) Applicant: Nissan Chemical Industries, Ltd., Tokyo (JP)

(72) Inventor: Kazuya Ebara, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 13/742,860

(22) Filed: Jan. 16, 2013

(65) Prior Publication Data

US 2013/0131282 A1     May 23, 2013

Related U.S. Application Data

(62) Division of application No. 12/747,543, filed as application No. PCT/JP2008/072693 on Dec. 12, 2008, now abandoned.

(30) Foreign Application Priority Data

Dec. 14, 2007 (JP) .............................. 2007-323639
Sep. 30, 2008 (JP) .............................. 2008-254178

(51) Int. Cl.
| | |
|---|---|
| *G03F 7/039* | (2006.01) |
| *C08J 5/18* | (2006.01) |
| *C08G 73/10* | (2006.01) |
| *G03F 7/00* | (2006.01) |
| *G03F 7/023* | (2006.01) |

(52) U.S. Cl.
CPC . *G03F 7/039* (2013.01); *C08J 5/18* (2013.01); *C08G 73/1064* (2013.01); *G03F 7/0007* (2013.01); *C08G 73/1039* (2013.01); *C08J 2379/08* (2013.01); *G03F 7/0233* (2013.01); *C08G 73/1067* (2013.01)
USPC ....................................................... 525/431

(58) Field of Classification Search
USPC ............... 525/431, 434; 528/170, 310, 322; 430/270.1
See application file for complete search history.

(56) References Cited

U.S. PATENT DOCUMENTS

| | | | |
|---|---|---|---|
| 5,114,826 A | 5/1992 | Kwong et al. | |
| 5,606,014 A | 2/1997 | Connell et al. | |
| 5,689,004 A | 11/1997 | Connell et al. | |
| 6,677,099 B1 | 1/2004 | Ishii et al. | |
| 6,723,484 B1* | 4/2004 | Tomikawa et al. | 430/192 |
| 7,026,080 B2 | 4/2006 | Nakayama et al. | |
| 2006/0048963 A1* | 3/2006 | Nishinaka et al. | 174/52.2 |
| 2007/0154658 A1* | 7/2007 | Kang et al. | 428/1.25 |
| 2010/0304291 A1 | 12/2010 | Ebara | |

FOREIGN PATENT DOCUMENTS

| | | |
|---|---|---|
| JP | A-02-151629 | 6/1990 |
| JP | A-2000-505119 | 4/2000 |
| JP | A-2002-212287 | 7/2002 |
| JP | A-2005-173027 | 6/2005 |
| JP | A-2008-076739 | 4/2008 |
| WO | WO 01/53101 A1 | 7/2001 |

OTHER PUBLICATIONS

International Search Report issued in Application No. PCT/JP2008/072693; dated Feb. 3, 2009 (with translation).
Office Action dated Jul. 16, 2012 issued in U.S. Appl. No. 12/747,543.
U.S. Appl. No. 12/747,543 filed in the name of Ebara, on Aug. 10, 2010.

* cited by examiner

*Primary Examiner* — Gregory Listvoyb
(74) *Attorney, Agent, or Firm* — Oliff PLC

(57) ABSTRACT

There is provided a simple production method of polyhydroxyimide and a positive photosensitive resin composition containing the polyhydroxyimide. A production method of a polyhydroxyimide comprising: adding an acid component that is at least one type of carboxylic acid having a pKa of 0 to 5 to a polyhydroxyimide precursor of Formula (1):

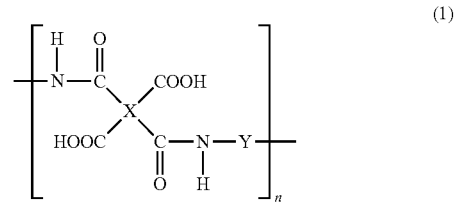

(where X is a tetravalent aliphatic or aromatic group, Y is an organic group containing an aromatic group substituted with at least one OH group, and n is an integer of 1 or more); and heating the resultant mixture to a temperature of 50 to 100° C. to prepare a poly imide of Formula (2):

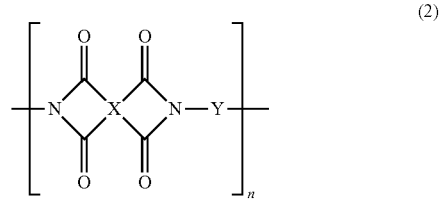

(where X, Y and n are the same as those defined above) having a weight average molecular weight of 3,000 to 100,000.

23 Claims, No Drawings

PRODUCTION METHOD OF POLYHYDROXYIMIDE AND POSITIVE PHOTOSENSITIVE RESIN COMPOSITION CONTAINING POLYHYDROXYIMIDE OBTAINED BY THE PRODUCTION METHOD

This is a Division of application Ser. No. 12/747,543 filed Aug. 10, 2010, which in turn is a National Stage Application of PCT/JP2008/072693, filed Dec. 12, 2008, which claims the benefit of JP 2007-323639, filed Dec. 14, 2007 and JP 2008-254178, filed Sep. 30, 2008. The disclosure of the prior applications is hereby incorporated by reference herein in its entirety.

TECHNICAL FIELD

The present invention relates to a production method of a polyhydroxyimide, particularly to a production method of a polyhydroxyimide aimed at improving problems in a thermal imidization method or a chemical imidization method, which is a production method of a polyimide in the related art.

In addition, the present invention relates to a positive photosensitive resin composition containing the polyhydroxyimide obtained by the above production method, a cured film of the positive photosensitive resin composition, and various materials using the cured film.

BACKGROUND ART

Generally, as the production method of a polyimide, there is adopted a method including: synthesizing a polyamic acid which is an imide precursor by reacting a tetracarboxylic dianhydride and a diamine as monomers; and imidizing the polyamic acid by using either (a) a thermal imidization method for cyclizing by heating and dehydrating or (b) a chemical imidization method for cyclizing using a dehydrocondensing agent and an imidization catalyst.

The (a) thermal imidization method is a method for imidization in which a heating-dehydration reaction is effected by the use of an acid catalyst and an azeotropic solvent as assistants for the imidization reaction. At this time, generally, the polyamic acid is heated to a temperature of 180° C. to 250° C. to effect the reaction.

In contrast, as the (b) chemical imidization method, there is known a method in which a dehydrocondensing agent and a ring-closure catalyst are directly added to a polyamic acid solution to heat and dry the resultant mixture. As the dehydrocondensing agent, there are known carboxylic anhydrides such as acetic anhydride, propionic anhydride and benzoic anhydride, and dicyclohexylcarbodiimide (DDC). As the ring-closure catalyst, there are known aliphatic tertiary amines such as triethylamine, and heterocyclic tertiary amines such as isoquinoline, pyridine, β-picoline, aminopyridine and imidazole, and particularly, an acetic anhydride-pyridine type is widely used (for example, Patent Document 1).

On the other hand, a polyimide resin is excellent in heat resistance, electric insulation, solvent resistance and mechanical stability, and is used in various fields.

Particularly, in a field of electric and electronic materials, it has been found that a cured film produced from a photosensitive polyhydroxyimide-based resin to which photosensitive properties are imparted by introducing a hydroxy group into a polyimide possesses not only the above characteristics of a polyimide-based resin, but also high resolution and high sensitivity. Therefore, the application of such a cured film has been expanded and starts to prevail not only in a semiconductor field, but also in a display field.

For example, as a material capable of obtaining a positive pattern having high resolution, high sensitivity and advantageous dimension controllability, there is disclosed a positive photosensitive resin composition using a polyhydroxyimide (Patent Document 2).

A polyhydroxyimide can be obtained from a precursor polyhydroxyamic acid by the (a) thermal imidization method or the (b) chemical imidization method. However, actually, in the (b) chemical imidization method, even a hydroxy group in side chains of a polyamic acid is reacted with a large amount of acetic anhydride existing within the reaction system to be converted into an acetoxy group. This means that when a polyhydroxyimide is applied in a photosensitive resin composition or the like, a necessary developing group (hydroxy group) becomes deactivated.

Therefore, there is disclosed a method including: synthesizing an imide precursor in, for example, N-methyl-2-pyrrolidone (NMP): adding an aromatic hydrocarbon solvent (such as m-xylene) which azeotropically boils with water as a dehydrating agent to the imide precursor; and heating the resultant mixture to 180° C. to subject the imide precursor to a dehydration reaction to imidize the imide precursor (Patent Document 2).

As another method, there is also disclosed a method for directly producing a polyhydroxyimide, for example, by heating an acid dianhydride and a diamine at a high temperature (180° C.) in the presence of an acid catalyst (γ-valerolactone) and a base (pyridine) in a solvent mixture of an aprotic polar solvent (such as NMP) and a dehydrating solvent (such as toluene) to progress the reaction while azeotropically removing a water content (Patent Document 3).

Patent Document 1: Japanese Patent Application Publication No. JP-A-2-151629
Patent Document 2: Japanese Patent Application Publication No. JP-A-2005-173027
Patent Document 3: Japanese Patent Application Publication No. JP-A-2002-212287

DISCLOSURE OF THE INVENTION

Problems to be Solved by the Invention

As described above, when a poly hydroxyimide useful as a photosensitive resin composition is produced from a polyamic acid by a chemical imidization, salts are generated from a dehydrocondensing agent and a ring-closure catalyst, and a series of processes requires a long time so that producing a polyhydroxyimide also takes a long time.

On the other hand, a thermal imidization method requires such a high temperature as 180° C. and an azeotropic dehydration operation during the production, and a method for directly producing a polyhydroxyimide requires addition of a base and an azeotropic dehydrating solvent in comparison with a common production method of a polyimide. Thus, there are many disadvantages in the above methods from the viewpoint of the industrial production method.

In order to solve the problems described above, it is an object of the present invention to provide a simple production method of a polyhydroxyimide advantageous also from the viewpoint of the industrial production method for solving problems of a chemical imidization method and a thermal imidization method in the related art.

Further, it is another object of the present invention to provide a positive photosensitive resin composition using the polyhydroxyimide obtained by the production method.

Means for Solving the Problems

As a result of assiduous research intended to overcome these disadvantages, the inventor of the present invention has found that by adding a weak acid such as acetic acid as an acid component to a polyhydroxyamic acid obtained by reacting a component selected from a tetracarboxylic acid and a derivative of the tetracarboxylic acid with a diamine component having one or more hydroxy group(s), a polyhydroxyimide can be produced without requiring the use of a base or an azeotropic dehydration operation, and has completed the present invention.

Specifically, the present invention relates to, according to a first aspect, a production method of a polyhydroxyimide, characterized by including:

adding an acid component that is at least one type of carboxylic acid having a pKa of 0 to 5 to a poly hydroxyimide precursor of Formula (1):

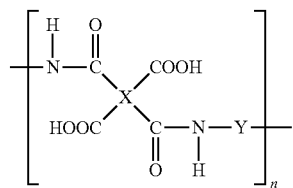

(where X is a tetravalent aliphatic or aromatic group,
Y is an organic group containing an aromatic group substituted with at least one OH group, and
n is an integer of 1 or more); and
heating the resultant mixture to a temperature of 50 to 100° C. to prepare a polyimide of Formula (2):

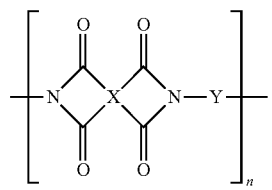

(where X, Y and n are the same as those defined above) having a weight average molecular weight of 3,000 to 100,000.

According to a second aspect, in the production method of a polyhydroxyimide according to the first aspect, Y is an organic group containing a benzene ring substituted with at least one OH group.

According to a third aspect, in the production method of a polyhydroxyimide according to the second aspect, Y is an organic group containing two or more benzene rings substituted with at least one OH group.

According to a fourth aspect, in the production method of a polyhydroxyimide according to the third aspect, Y contains at least one type of structure selected from the structures of Formula (3) to Formula (5):

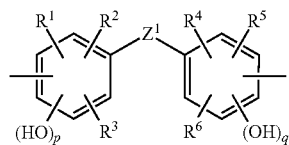

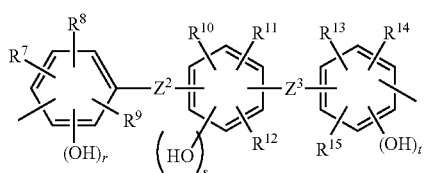

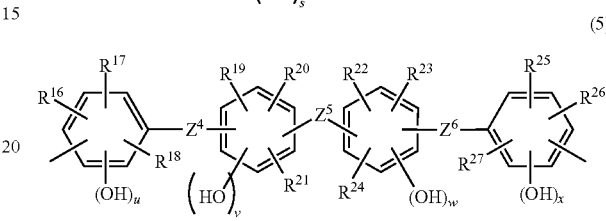

(where $R^1$ to $R^{27}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxyl group, a phospho group, a sulfo group, a phenyl group which may be substituted with W, a naphthyl group which may be substituted with W, a thienyl group which may be substituted with W or a furyl group which may be substituted with W, W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phospho group or a sulfo group, $Z^1$ to $Z^6$ are a single bond, a $C_{1-10}$ alkylene group which may be substituted with $W^1$, —C(O)O—, —C(O)NH—, —O—, —S—, —S(O)$_2$— or —C(O)—, $W^1$ is a $C_{1-10}$ alkyl group, a $C_{1-10}$ haloalkyl group or a $C_{1-10}$ alkoxy group, and p to x are an integer of 1 or more and satisfy $2 \geq p+q \geq 1$, $2 \geq r+s+t \geq 1$ and $2 \geq u+v+w+x \geq 1$).

According to a fifth aspect, in the production method of a polyhydroxyimide according to the fourth aspect, $Z^1$ to $Z^6$ are a single bond, —CH$_2$—, —C(CH$_3$)$_2$—, —C(CF$_3$)$_2$—, —C(O)NH—, —O—, —S(O)$_2$— or —C(O)—.

According to a sixth aspect, in the production method of a polyhydroxyimide according to any one of the first aspect to the fifth aspect, the carboxylic acid is a carboxylic acid of Formula (6):

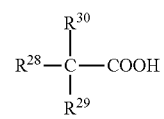

(where $R^{28}$ to $R^{30}$ are independently a hydrogen atom, $C_{1-5}$ alkyl group, a $C_{1-5}$ haloalkyl group, a halogen atom, a nitro group, a phenyl group which may be substituted with $W^2$, a naphthyl group which may be substituted with $W^2$, a thienyl group which may be substituted with $W^2$ or a furyl group which may be substituted with $W^2$, and $W^2$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phospho group or a sulfo group).

According to a seventh aspect, in the production method of a polyhydroxyimide according to the sixth aspect, the carboxylic acid of Formula (6) is a $C_{1-6}$ aliphatic carboxylic acid.

According to an eighth aspect, in the production method of a polyhydroxyimide according to the seventh aspect, in Formula (6), $R^{28}$ to $R^{30}$ are a hydrogen atom or a halogen atom.

According to a ninth aspect, in the production method of a polyhydroxyimide according to the eighth aspect, the carboxylic acid of Formula (6) is acetic acid or trifluoroacetic acid.

According to a tenth aspect, in the production method of a polyhydroxyimide according to any one of the first aspect to the ninth aspect, the acid component is added in a mass 0.1 to 2 times the mass of the polyhydroxyimide precursor of Formula (1).

According to an eleventh aspect, in the production method of a polyhydroxyimide according to any one of the first aspect to the tenth aspect, the heating temperature is 50 to 80° C.

According to a twelfth aspect, a production method of a polyhydroxyimide is characterized by including:
adding an acid component that is at least one type of carboxylic acid having a pKa of 0 to 5 to a polyhydroxyimide precursor having a unit structure of Formula (7):

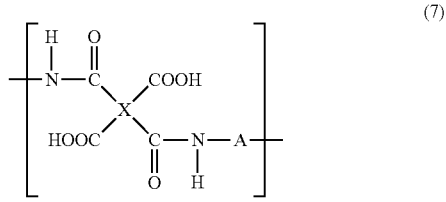

(where X is a tetravalent aliphatic or aromatic group,
A is either an organic group containing an aromatic group substituted with at least one OH group or a group of Formula (9):

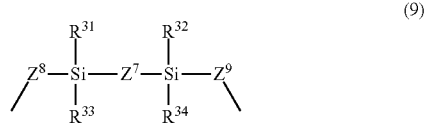

(where $R^{31}$ to $R^{34}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxyl group, a phospho group, a sulfo group, a phenyl group which is optionally substituted with $W^3$, a naphthyl group which is optionally substituted with $W^3$, a thienyl group which is optionally substituted with $W^3$ or a furyl group which is optionally substituted with $W^3$, $W^3$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phospho group or a sulfo group.

$Z^7$ to $Z^9$ are independently a single bond, a $C_{1-10}$ alkylene group which is optionally substituted with $W^4$, —C(O)O—, —C(O)NH—, —O—, —S—, —S(O)$_2$— or —C(O)—, and $W^4$ is a $C_{1-10}$ alkyl group, a $C_{1-10}$ haloalkyl group or a $C_{1-10}$ alkoxy group)) (with proviso that the polyhydroxyimide precursor contains a unit structure containing the organic group containing an aromatic group substituted with at leas one OH group and a unit structure containing the group of Formula (9)); and heating the resultant mixture to a temperature of 50 to 100° C. to prepare a polyimide of Formula (8):

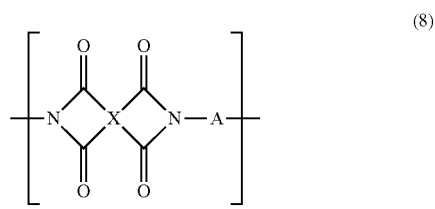

(where X and A are the same as those defined above)
having a weight average molecular weight of 3,000 to 100,000.

According to a thirteenth aspect, in the production method of a polyhydroxyimide according to the twelfth aspect, the organic group as A containing an aromatic group substituted with at least one OH group is an organic group containing a benzene ring substituted with at least one OH group.

According to a fourteenth aspect, in the production method of a polyhydroxyimide according to the thirteenth aspect, the organic group as A containing an aromatic group substituted with at least one OH group is an organic group containing two or more benzene rings substituted with at least one OH group.

According to a fifteenth aspect, in the production method of a polyhydroxyimide according to the fourteenth aspect, the organic group as A containing an aromatic group substituted with at least one OH group is an organic group containing at least one type of structure selected from structures of Formula (3) to Formula (5):

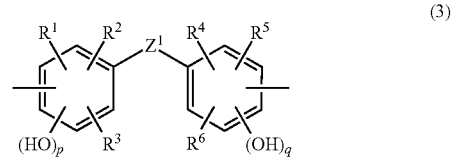

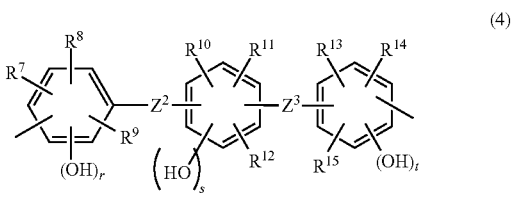

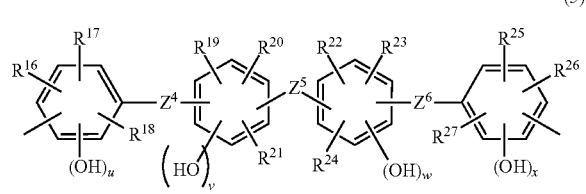

(where $R^1$ to $R^{27}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxyl group, a phospho group, a sulfo group, a phenyl group which may be substituted with W, a naphthyl group which may be substituted with W, a thienyl group which may be substituted with W or a furyl group which may be substituted with W, W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phospho group or a sulfo group, $Z^1$ to $Z^6$ are a single bond, a $C_{1-10}$ alkylene group which may be substituted with $W^1$, —C(O)O—, —C(O)NH—, —S—, —S(O)$_2$— or —C(O)—, $W^1$ is a $C_{1-10}$ alkyl group, a $C_{1-10}$ haloalkyl group or a $C_{1-10}$ alkoxy group, and p to x are an integer of 1 or more and satisfy $2 \geq p+q \geq 1$, $2 \geq r+s+t \geq 1$ and $2 \geq u+v+w+x \geq 1$).

According to a sixteenth aspect, in the production method of a polyhydroxyimide according to the fifteenth aspect, $Z^1$ to $Z^6$ are a single bond, —CH$_2$—, —C(CH$_3$)$_2$—, —C(CF$_3$)$_2$—, —C(O)NH—, —O—, —S(O)$_2$— or —C(O)—.

According to a seventeenth aspect, in the production method of a polyhydroxyimide according to any one of the twelfth aspect to the sixteenth aspect, in Formula (9), $R^{31}$ to $R^{34}$ are a methyl group, $Z^7$ is —O—, and $Z^8$ and $Z^9$ are a propylene group.

According to an eighteenth aspect, in the production method of a polyhydroxyimide according to any one of the twelfth aspect to the seventeenth aspect, the carboxylic acid is a carboxylic acid of Formula (6):

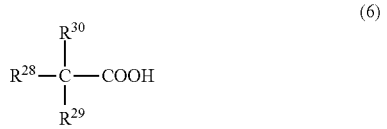

(6)

(where $R^{28}$ to $R^{30}$ are independently a hydrogen atom, a $C_{1-5}$ alkyl group, a $C_{1-5}$ haloalkyl group, a halogen atom, a nitro group, a phenyl group which may be substituted with $W^2$, a naphthyl group which may be substituted with $W^2$, a thienyl group which may be substituted with $W^2$ or a furyl group which may be substituted with $W^2$, and $W^2$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phospho group or a sulfo group).

According to a nineteenth aspect, in the production method of a polyhydroxyimide according to the eighteenth aspect, the carboxylic acid of Formula (6) is a $C_{1-6}$ aliphatic carboxylic acid.

According to a twentieth aspect, in the production method of a hydroxyimide according to the nineteenth aspect, in Formula (6), $R^{28}$ to $R^{30}$ are a hydrogen atom or a halogen atom.

According to a twenty-first aspect, in the production method of a polyhydroxyimide according to the twentieth aspect, the carboxylic acid of Formula (6) is acetic acid or trifluoroacetic acid.

According to a twenty-second aspect, in the production method of a polyhydroxyimide according to any one of the twelfth aspect to the twenty-first aspect, the acid component is added in a mass 0.1 to 2 times the mass of the polyhydroxyimide precursor having a unit structure of Formula (7).

According to a twenty-third aspect, in the production method of a polyhydroxyimide according to any one of the twelfth aspect to the twenty-second aspect, the heating temperature is 50 to 80° C.

According to a twenty-fourth aspect, in a polyhydroxyimide obtained by the production methods of a polyhydroxyimide as described in the eleventh aspect to the eleventh aspect, the imidization rate is 85% or more and a hydroxy group is not acetoxylated.

According to a twenty-fifth aspect, in a polyhydroxyimide obtained by the production methods of a polyhydroxyimide as described in the twelfth aspect to the twenty-third aspect in which the imidization rate is 85% or more and a hydroxy group is not acetoxylated.

According to a twenty-sixth aspect, a positive photosensitive resin composition contains the polyhydroxyimide as described in the twenty-fourth aspect as an (A) component and a compound generating an acid by being irradiated with light as a (B) component, both of which are dissolved in a (C) solvent.

According to a twenty-seventh aspect, a positive photosensitive resin composition contains the polyhydroxyimide as described in the twenty-fifth aspect as an (A) component and a compound generating an acid by being irradiated with light as a (B) component, both of which are dissolved in a (C) solvent.

According to a twenty-eighth aspect, in the positive photosensitive resin composition according to the twenty-sixth aspect or the twenty-seventh aspect, the (B) component is a naphthoquinonediazide sulfonic acid ester compound.

According to a twenty-ninth aspect, in the positive photosensitive resin composition according to the twenty-sixth aspect to the twenty-eighth aspect, the (C) solvent is at least one type selected from a group consisting of an alcohol having 4 or more carbon atoms, and an alkyl ester.

According to a thirtieth aspect, the positive photosensitive resin composition according to any one of the twenty-sixth aspect to the twenty-ninth aspect contains 0.01 to 100 parts by mass of the (B) component, based on 100 parts by mass of the (A) component.

According to a thirty-first aspect, the positive photosensitive resin composition according to the thirtieth aspect further contains 5 to 100 parts by mass of a crosslinkable compound as a (D) component, based on 100 parts by mass of the (A) component.

According to a thirty-second aspect, the present invention relates to a cured film obtained using the positive photosensitive resin composition as described in any one of the twenty-sixth aspect to the thirty-first aspect.

According to a thirty-third aspect, the present invention relates to an electronic part having a cured film as described in the thirty-second aspect.

According to a thirty-fourth aspect, the present invention relates to an organic EL element having a cured film as described in the thirty-second aspect.

According to a thirty-fifth aspect, a forming method of a relief pattern includes: applying the positive photosensitive resin composition as described in any one of the twenty-sixth aspect to the thirty-first aspect on a substrate; heating and drying the composition; and irradiating the composition with an ultraviolet ray to develop a pattern.

Effects of the Invention

According to the production method of the present invention, a polyhydroxyimide can be readily produced from a polyhydroxyamic acid without requiring a high temperature-heating operation, an azeotropic dehydration operation, addition of a base or an azeotropic dehydrating solvent, or the like, which are required during the production of a polyhydroxyimide in the related art. Particularly, according to the production method of the present invention, the reaction can be progressed at a reaction temperature of 100° C. or less, so that the production method of the present invention is an industrial production method having high practicality.

Then, by the above simplification of production processes and the reduction of the number of processes, the production method of the present invention can achieve the cost reduction or the like.

In addition, the positive photosensitive composition of the present invention containing the polyhydroxyimide obtained by the above production method of the present invention does not cause such a large film loss of an unexposed portion as causing a problem during the development, and can form a fine pattern.

BEST MODES FOR CARRYING OUT THE INVENTION

As described above, a related-art production method of a polyhydroxyimide has problems that a side reaction is caused, that a synthetic method is cumbersome, and the like. In other words, in a chemical imidization (using acetic anhydride and a base) method, a hydroxy group is converted into an acetoxy group. A thermal imidization method requires a high temperature nearly 200° C. so that this method is unsuitable for the mass production, and the method also requires a process for an azeotropic operation or the like. Accordingly, these related-art production methods of a polyhydroxyimide are unsuitable as an industrial production method when a polyhydroxyimide is applied to a photosensitive resin composition.

The present invention has such a characteristic that the present invention improves the problems of the related-art production method, for example, by using a weak acid such as acetic acid. In other words, the present invention relates to a production method of a polyhydroxyimide characterized by including adding an acid component that is at least one type of carboxylic acid having a pKa of 0 to 5 to a polyhydroxyimide precursor of Formula (1) or a polyhydroxyimide precursor having a unit structure of Formula (7), and heating the resultant mixture to a temperature of 50 to 100° C. to prepare a polyhydroxyimide having a weight average molecular weight of 3,000 to 100,000.

In addition, the present invention relates to a positive photosensitive composition containing the polyhydroxyimide obtained by the above production method, a cured film of the positive photosensitive composition, and various materials using the cured film.

Hereinafter, the present invention is described in more detail.

<Polyhydroxyimide Precursor>

The polyhydroxyimide precursor used in the present invention is produced containing a repeating unit of Formula (1):

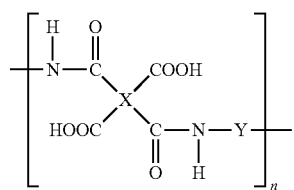

(1)

and having a weight average molecular weight of 3,000 to 100,000.

In the above formula, X is a tetravalent aliphatic or aromatic group, Y is an organic group containing an aromatic group substituted with at least one OH group, and n is an integer of 1 or more.

In Formula (1), Y is preferably an organic group containing a benzene ring substituted with at least one OH group, particularly, Y is more preferably an organic group containing two or more benzene rings substituted with at least one OH group.

Examples of Y include groups having structures of Formula (3) to Formula (5):

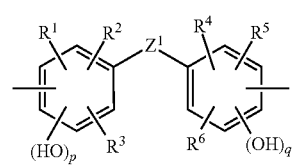

(3)

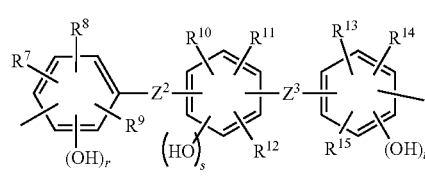

(4)

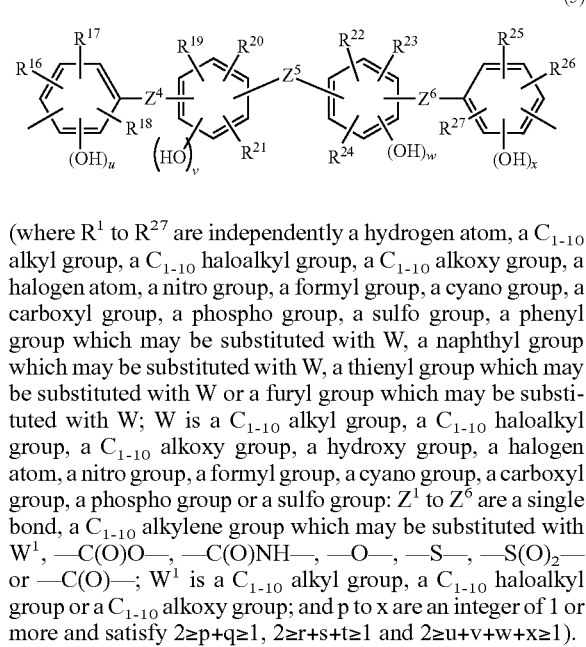

(5)

(where $R^1$ to $R^{27}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxyl group, a phospho group, a sulfo group, a phenyl group which may be substituted with W, a naphthyl group which may be substituted with W, a thienyl group which may be substituted with W or a furyl group which may be substituted with W; W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phospho group or a sulfo group: $Z^1$ to $Z^6$ are a single bond, a $C_{1-10}$ alkylene group which may be substituted with $W^1$, —C(O)O—, —C(O)NH—, —O—, —S—, —S(O)$_2$— or —C(O)—; $W^1$ is a $C_{1-10}$ alkyl group, a $C_{1-10}$ haloalkyl group or a $C_{1-10}$ alkoxy group; and p to x are an integer of 1 or more and satisfy 2≥p+q≥1, 2≥r+s+t≥1 and 2≥u+v+w+x≥1).

In Formulae (3) to (5), $Z^1$ to $Z^6$ are desirably a single bond, —CH$_2$—, —C(CH$_3$)$_2$—, —C(CF$_3$)$_2$—, —C(O)NH—, —O—, —S(O)$_2$— or —C(O)—.

Y is particularly preferably a group having an OH group at an o-position relative to a —NH group adjacent to Y among the groups of Formulae (3) to (5).

In addition, the polyhydroxyimide precursor used in the present invention contains a unit structure of Formula (7):

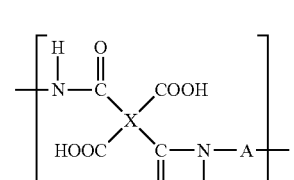

(7)

and has a weight average molecular weight of 3,000 to 100,000.

In the above formula, X is a tetravalent aliphatic or aromatic group, A is an organic group containing an aromatic group substituted with at least one OH group or a group of the following Formula (9).

Here, the above polyimide precursor contains both of a unit structure containing the organic group containing an aromatic group substituted with at least one OH group and a unit structure containing a group of the following Formula (9).

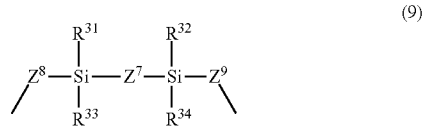
(9)

In the above formula, $R^{31}$ to $R^{34}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxyl group, a phospho group, a sulfo group, a phenyl group which may be substituted with $W^3$, a naphthyl group which may be substituted with $W^3$, a thienyl group which may be substituted with $W^3$ or a furyl group which may be substituted with $W^3$.

$W^3$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phospho group or a sulfo group, and $Z^7$ to $Z^9$ are independently a single bond, a $C_{1-10}$ alkylene group which may be substituted with $W^3$, —C(O)O—, —C(O)NH—, —O—, —S—, —S(O)$_2$— or —C(O)—.

$W^4$ is a $C_{1-10}$ alkyl group, a $C_{1-10}$ haloalkyl group or a $C_{1-10}$ alkoxy group.

In Formula (7), examples of the organic group of A containing an aromatic group substituted with at least one OH group include the same as those defined as Y in Formula (1).

In addition, in Formula (7), in a group of Formula (9) that is A, it is preferred that $R^{31}$ to $R^{34}$ are a methyl group, $Z^7$ is —O—, and $Z^8$ and $Z^9$ are a propylene group.

A polyhydroxyimide precursor of Formula (1) (polyhydroxyamic acid) or a polyhydroxyimide precursor having a unit structure of Formula (7) (polyhydroxyamic acid) used in the present invention can be obtained, for example, by reacting a tetracarboxylic acid component with a diamine component.

Here, the tetracarboxylic acid component and the diamine component used in the present invention are not particularly limited. However, from the viewpoint of the solubility of the obtained polyhydroxyimide precursor in an organic solvent, it is preferred that at least one of the tetracarboxylic acid component and the diamine component contains a component having an organic group having fluorine at least in a part of the component. The organic group having fluorine in the tetracarboxylic acid component or the diamine component is not particularly limited. However, a fluoro group or a fluoroalkyl group directly bonded to a benzene ring is preferable. Among such tetracarboxylic acid components or diamine components, from the viewpoint of the solubility in a solvent, preferred are a tetracarboxylic acid component and a diamine component having a trifluoromethyl group or a hexafluoroisopropylidene group. In addition, to such organic groups, one fluorine atom or a plurality of fluorine atoms may be bonded.

[Tetracarboxylic Acid Component]

The tetracarboxylic acid component that can be used as a monomer component constituting a polyhydroxyimide precursor of Formula (1) (polyhydroxyamic acid) or a polyhydroxyimide precursor of Formula (7) (polyhydroxyamic acid) that are used in the production method of the present invention is not particularly limited so long as the tetracarboxylic acid component is a tetracarboxylic acid, an acid dianhydride of the tetracarboxylic acid or a compound derived from the tetracarboxylic acid or the acid dianhydride of the tetracarboxylic acid. Specific examples of the tetracarboxylic acid component are described below.

The specific examples include compounds such as aromatic tetracarboxylic acids such as pyromellitic acid, 3,3',4,4'-biphenyltetracarboxylic acid, 3,3',4,4'-benzophenonetetracarboxylic acid, 3,3',4,4'-diphenylethertetracarboxylic acid, 3,3',4,4'-diphenylsulfonetetracarboxylic acid, and 3,4-dicarboxy-1,2,3,4-tetrahydro-1-naphthalenesuccinic acid, dianhydrides of these aromatic tetracarboxylic acids and derivatives of these aromatic tetracarboxylic acids or these dianhydrides; alicyclic tetracarboxylic acids such as 1,2,3,4-cyclobutanetetracarboxylic acid, 1,2-dimethyl-1,2,3,4-cyclobutanetetracarboxylic acid, 1,2,3,4-tetramethyl-1,2,3,4-cyclobutanetetracarboxylic acid, 1,2,3,4-cyclopentanetetracarboxylic acid, 1,2,4,5-cyclohexanetetracarboxylic acid, 5-(2,5-dioxotetrahydrofuryl)-3-methyl-3-cyclohexene-1,2-dicarboxylic acid, 2,3,5-tricarboxy-2-cyclopentaneacetic acid, bicyclo[2.2.2]octo-7-ene-2,3,5,6-tetracarboxylic acid, 2,3,4,5-tetrahydrofurantetracarboxylic acid, and 3,5,6-tricarboxy-2-norbornaneacetic acid, dianhydrides of these alicyclic tetracarboxylic acids and derivatives of these alicyclic tetracarboxylic acids or these dianhydrides; and aliphatic tetracarboxylic acids such as 1,2,3,4-butanetetracarboxylic acid, dianhydrides of these aliphatic tetracarboxylic acids and derivatives of these aliphatic tetracarboxylic acids or these dianhydrides. Further, examples of the tetracarboxylic acid component having an organic group having fluorine include compounds having a trifluoromethyl group or a hexafluoroisopropylidene group such as 2,2-bis(3,4-dicarboxyphenyl)hexafluoroisopropylidene, 4,4'-hexafluoroisopropylidene-diphthalic acid, dianhydrides of these compounds and derivatives of these compounds or these dianhydrides, to which the examples are not limited.

In addition, as the tetracarboxylic acid component, the tetracarboxylic acids and derivatives of the tetracarboxylic acids may be used individually or in combination of two or more types thereof.

[Diamine Component]

The diamine component as a monomer component constituting a polyhydroxyimide precursor (polyhydroxyamic acid) of Formula (1) used in the production method of the present invention is a diamine containing an aromatic group substituted with at least one OH group.

In addition, the diamine component as a monomer component constituting a polyhydroxyimide precursor (polyhydroxyamic acid) having a unit structure of Formula (7) is a diamine containing an aromatic group substituted with at least one OH group and a diamine having a group of Formula (9).

The diamine containing an aromatic group substituted with at least one OH group is not particularly limited and examples of such a diamine include 3,3'-diamino-4,4''-dihydroxybiphenyl (4BP), 3,3'-diamino-2,2'-dihydroxybiphenyl (2BP), 2,2'-bis(3-amino-4-hydroxyphenyl)hexafluoropropane (BAHF), 2,2-bis(4-amino-3,5-dihydroxyphenyl)hexafluoropropane, 2,2-bis[4-(3-amino-4-hydroxyphenoxy)phenyl]

hexafluoropropane, bis(3-amino-4-hydroxyphenyl)methane (BAPF), 3,3'-diamino-4,4'-dihydroxybenzophenone (AHPK), 3,3'-diamino-4,4'-dihydroxy-phenyl ether (AHPE), 3,3'-diamino-4,4'-dihydroxy-thiophenyl ether, 2,2'-bis(3-amino-4-hydroxyphenyl)propane (BAPA), (3-amino-4-hydroxy)phenyl(3-amino-4-hydroxy)anilide (AHPA), bis(3-amino-4-hydroxyphenyl)sulfone (BSDA), bis-N,N'-(p-aminobenzoyl)-hexafluoro-2,2'-bis(4-hydroxyphenyl) propane (BABHBPA), [4-(4-aminophenoxy)phenyl]sulfone, 2,4-diaminophenol, 3,5-diaminophenol, 2,5-diaminophenol, 4,6-diaminoresorcinol, 2,5-diaminohydroquinone, bis(3-amino-4-hydroxyphenyl)thioether, bis(4-amino-3,5-dihydroxyphenyl)thioether, bis(3-amino-4-hydroxyphenyl)ether, bis(4-amino-3,5-dihydroxyphenyl)ether, bis(3-amino-4-hydroxyphenyl)methane, bis(4-amino-3,5-dihydroxyphenyl) methane, bis(3-amino-4-hydroxyphenyl)sulfone, bis(4-amino-3,5-dihydroxyphenyl)sulfone, 4,4'-diamino-3,3'-dihydroxybiphenyl (3BP), 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy)benzene, 1,3-bis(3-amino-4-hydroxy phenoxy)benzene, 1,4-bis(4-amino-3-hydroxyphenoxy)benzene, 1,3-bis(4-amino-3-hydroxyphenoxy)benzene, bis[4-(3-amino-4-hydroxyphenoxy)phenyl]sulfone, bis[4-(3-amino-4-hydroxyphenoxy)phenyl]propane and 1,4-bis(4-aminophenoxy)benzene, to which the examples are not limited.

Among the above diamine components, preferred are 3,3'-diamino-4,4'-dihydroxybiphenyl (4BP), 3,3'-diamino-2,2'-dihydroxybiphenyl (2BP), 2,2'-bis(3-amino-4-hydroxyphenyl)hexafluoropropane (BAHF), 2,2-bis(4-amino-3,5-dihydroxyphenyl)hexafluoropropane, 2,2-bis[4-(3-amino-4-hydroxyphenoxy)phenyl]hexafluoropropane, bis(3-amino-4-hydroxyphenyl)methane (BAPF), 3,3'-diamino-4,4'-dihydroxybenzophenone (AHPK), 3,3'-diamino-4,4'-dihydroxy-phenyl ether (AHPE), 3,3'-diamino-4,4'-dihydroxy-thiophenyl ether, 2,2'-bis(3-amino-4-hydroxyphenyl)propane (BAPA), (3-amino-4-hydroxy) phenyl(3-amino-4-hydroxy)anilide (AHPA), bis(3-amino-4-hydroxyphenyl)sulfone (BSDA), bis-N,N'-(p-aminobenzoyl)-hexafluoro-2,2'-bis(4-hydroxyphenyl) propane (BABHBPA), [4-(4-aminophenoxy)phenyl]sulfone, 2,4-diaminophenol, 2,5-diaminophenol, 4,6-diaminoresorcinol, 2,5-diaminohydroquinone, bis(3-amino-4-hydroxyphenyl)thioether, bis(4-amino-3,5-dihydroxyphenyl)thioether, bis(3-amino-4-hydroxyphenyl)ether, bis(3-amino-4-hydroxyphenyl)methane, bis(3-amino-4-hydroxyphenyl)sulfone, 4,4'-diamino-3,3'-dihydroxybiphenyl (3BP), 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy)benzene, 1,3-bis(3-amino-4-hydroxyphenoxy) benzene, 1,4-bis(4-amino-3-hydroxyphenoxy)benzene, 1,3-bis(4-amino-3-hydroxyphenoxy)benzene, bis[4-(3-amino-4-hydroxyphenoxy)phenyl]sulfone, bis[4-(3-amino-4-hydroxyphenoxy)phenyl]propane and 1,4-bis(4-aminophenoxy)benzene.

Particularly preferred are bis(3-amino-4-hydroxyphenyl) methane (BAPF), 2,2'-bis(3-amino-4-hydroxyphenyl)propane (BAPA), 2,2'-bis(3-amino-4-hydroxyphenyl)hexafluoropropane (BAHF), 3,3'-diamino-4,4'-dihydroxy-phenyl ether (AHPE), 3,3'-diamino-4,4'-dihydroxybenzophenone (AHPK), bis(3-amino-4-hydroxyphenyl)sulfide (BSDA), (3-amino-4-hydroxy)phenyl(3-amino-4-hydroxy)anilide (AHPA) and bis-N,N'-(p-aminobenzoyl)-hexafluoro-2,2'-bis (4-hydroxyphenyl)propane (BABHBPA).

In addition, the diamine having a group of Formula (9) is not particularly limited. However, preferred examples of the diamine include a siloxane-containing diamine. By using a siloxane-containing diamine in combination, the adhesion of a coating film produced from the polyhydroxyamide resin (A) to a substrate can be enhanced.

As particularly preferred examples of the siloxane-containing diamine, siloxane-containing diamines of Formula (10):

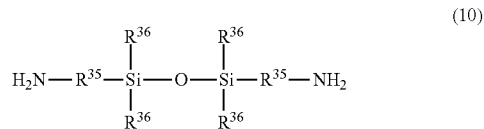

(where $R^{35}$ is a divalent organic group. $R^{36}$s are independently a monovalent organic group, and k is an integer of 1 or more) are preferred and among them, bis(3-aminopropyl)-1,1,3,3-tetramethyldisiloxane (APDS) is more preferred.

As the diamine component that is a monomer component constituting a polyhydroxyimide precursor (polyhydroxyamic acid) used in the production method of the present invention, besides the diamine containing an aromatic group substituted with at least one OH group and the diamine having a group of Formula (9), other diamines can also be used.

Those other diamine components are not particularly limited. However, preferred is a diamine containing an aromatic group, and particularly desired is a diamine containing one or more benzene ring(s).

Examples of the diamine containing an aromatic group among the above other diamines include p-phenylene diamine, m-phenylene diamine, 2,4,6-trimethyl-1,3-phenylenediamine, 2,3,5,6-tetramethyl-1,4-phenylenediamine, 4,4'-diaminodiphenyl ether (ODA), 3,4'-diaminodiphenyl ether, 3,3'-diaminodiphenyl ether, 4,4'-diaminodiphenylsulfide, 4,4'-diaminodiphenylmethane, 3,4'-diaminodiphenylmethane, 3,3'-diaminodiphenylmethane, 4,4-methylene-bis (2-methylaniline), 4,4'-methylene-bis(2,6-dimethylaniline), 4,4-methylene-bis(2,6-dimethylaniline), 4,4'-methylene-bis (2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis [4-(3-aminophenoxy)phenyl]sulfone, 2,2-bis[4-(4-aminophenoxy)phenyl]propane and 2,2-bis[4-(3-aminophenoxy)phenyl]propane.

Among them, particularly preferred examples of the diamine include 4,4'-diaminodiphenyl ether (ODA) and 1,3-bis(4-aminophenoxy)benzene (DA4P).

[Production Method of Polyhydroxyimide Precursor]

The polyhydroxyimide precursor (polyhydroxyamic acid) used in the production method of the present invention is obtained by subjecting the tetracarboxylic acid component and the diamine component (a diamine containing an aromatic group substituted with at least one OH group, or a diamine containing an aromatic group substituted with at least one OH group and a diamine containing a group of Formula (9)), and if desire, other diamine components to a polymerization reaction in an organic solvent.

The organic solvent used for the polymerization reaction is not particularly limited so long as the organic solvent is a solvent capable of dissolving the generated polyhydroxyimide precursor. However, to exemplify the organic solvent, specific examples of the organic solvent include polar solvents such as N-methylpyrrolidone, dimethylacetamide, γ-butyrolactone and diglyme. These solvents may be used individually or in combination of two or more types thereof. Further, even a solvent which cannot dissolve the polyhydroxyimide precursor may be mixed with the above organic solvent within a range in which the generated polyhydroxyimide precursor is not deposited.

In addition, the lower limit of the temperature range for the reaction between the tetracarboxylic acid component and the diamine component is usually −20° C. or more, preferably −5° C. or more. On the other hand, the upper limit of the temperature range is usually 150° C. or less, preferably 100° C. or less, and from the range between the upper limit and the lower limit, an arbitrary temperature can be selected. It is desired that the reaction is effected preferably at room temperature.

When the reaction temperature is set at a higher temperature, the polymerization reaction is rapidly progressed and is completed. However, when the reaction temperature is too high, a polyhydroxyimide precursor having a high molecular weight may not be obtained.

In addition, in the reaction effected in the organic solvent, the concentration of the solid content of both components (tetracarboxylic acid anhydride component and diamine component) in the solvent is not particularly limited. However, when the concentration is too low, a polyhydroxyimide precursor having a high molecular weight is difficult to be obtained. On the other hand, when the concentration is too high, the viscosity of the reaction mixture becomes too high, so that a homogeneous stirring of the reaction mixture becomes difficult. Therefore, the concentration of the solid content is preferably 1 to 50% by mass, more preferably 5 to 30% by mass. The polymerization reaction can be effected in an initial stage of the reaction with a high concentration of the solid content and thereafter, with the purification of the generated polymer (polyhydroxyimide precursor), the organic solvent can also be added.

The thus obtained polyhydroxyimide precursor-containing solution can be used as it is, for the preparation of a polyhydroxyimide described below. In addition, the polyhydroxyimide precursor can be recovered to be used by precipitation-isolating the precursor in a poor solvent such as water, methanol and ethanol.

<Acid Component that is Carboxylic Acid Having a pKa of 0 to 5>

The carboxylic acid having a pKa of 0 to 5 used in the present invention is preferably a carboxylic acid of Formula (6):

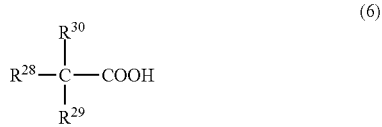

(6)

In the above formula, $R^{28}$ to $R^{30}$ are independently a hydrogen atom, a $C_{1-5}$ alkyl group, a $C_{1-5}$ haloalkyl group, a halogen atom, a nitro group, a phenyl group which may be substituted with $W^2$, a naphthyl group which may be substituted with $W^2$, a thienyl group which may be substituted with $W^2$ or a furyl group which may be substituted with $W^2$; and $W^2$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxy group, a phospho group or a sulfo group.

The carboxylic acid of Formula (6) is preferably a $C_{1-6}$ aliphatic carboxylic acid. Examples of such an aliphatic carboxylic acid include acetic acid, valeric acid, isovaleric acid, butyric acid, isobutyric acid, propionic acid, caproic acid, chloroacetic acid, dichloroacetic acid, bromoacetic acid, dibromoacetic acid, fluoroacetic acid, trifluoroacetic acid and pivalic acid.

Among these carboxylic acids, a carboxylic acid in which $R^{28}$ to $R^{30}$ are a hydrogen atom or a halogen atom in Formula (6) is preferred; acetic acid and trifluoroacetic acid are more preferred in terms of easy availability; and acetic acid is most preferred from the viewpoint of safety.

In addition, the carboxylic acid used in the present invention is more preferably a carboxylic acid having a pKa of 3.8 to 5.

Here, an acid anhydride such as acetic anhydride used in a general production method of a polyimide as a dehydrocondensing agent doesn't correspond to the acid component (carboxylic acid) in the present invention.

In addition, the acid component is added to the polyhydroxyimide precursor in a mass preferably 0.1 to 2 times, more preferably 0.1 to 1 time(s) the mass of the polyhydroxyimide precursor of Formula (1) or the polyhydroxyimide precursor having a unit structure of Formula (7).

<Production Method of Polyhydroxyimide>

The production method of the polyhydroxyimide of the present invention is in detail a production method including: adding the acid component to the polyhydroxyimide precursor of Formula (1) or the polyhydroxyimide precursor having a unit structure of Formula (7) in an organic solvent; and heating the resultant mixture to a temperature of 50 to 100° C. to effect the reaction to produce a polyhydroxyimide.

As the organic solvent, the organic solvent used in the production of the polyhydroxyimide precursor can be used. In addition, as described above, the polyhydroxyimide precursor solution obtained during the production of the polyhydroxyimide precursor as it is may be also used in the production of the polyhydroxyimide.

Further, the heating temperature is more preferably 50 to 80° C.

By heating to the above temperature for 18 hours to 24 hours, the polyimidization reaction is progressed.

The recovery of the thus obtained polyhydroxyimide is simply performed by a method including: charging the reaction mixture into a stirred poor solvent to precipitate the polyhydroxyimide: and filtering the precipitated polyhydroxyimide.

The poor solvent used at this time is not particularly limited. However, examples of the poor solvent include methanol, hexane, heptane, ethanol, toluene and water. After recovering the precipitate by filtration, the precipitate is preferably washed with the above poor solvent.

The recovered polyhydroxyimide can be converted into a polyhydroxyimide powder by drying the recovered polyhydroxyimide under normal pressure or reduced pressure either at normal temperature or by heating.

By repeating 2 to 10 times, such an operation that the polyhydroxyimide powder is further dissolved in a good solvent and the powder is reprecipitated in a poor solvent, impurities in the polymer can be furthermore reduced.

The good solvent used at this time is not particularly limited so long as the solvent can dissolve the polyhydroxyimide. However, examples of the good solvent include N,N-dimethylformamide, N,N-dimethylacetamide, 2-pyrrolidone, N-methyl-2-pyrrolidone, N-ethyl-2-pyrrolidone, N-vinyl-2-pyrrolidone, N-methylcaprolactam, dimethylsulfoxide, tetramethylurea, pyridine and γ-butyrolactone.

In addition, by using three or more types of poor solvents such as alcohols, ketones and hydrocarbons as the poor solvent used for the reprecipitation, the efficiency of the purification is furthermore enhanced.

[Positive Photosensitive Resin Composition]

The positive photosensitive resin composition of the present invention is a composition containing: as the (A) component, the polyhydroxyimide of Formula (2) or the polyhydroxyimide having a unit structure of Formula (8) that are produced by the above production method; as the (B) component, a compound generating an acid by being irradiated with light; the (C) solvent in which the (A) component and the (B) component are dissolved; and if desired, a crosslinkable compound as the (D) component and other additives such as a surfactant.

<(A) Component>

The (A) Component is the polyhydroxyimide of Formula (2) or the polyhydroxyimide having a unit structure of Formula (8), each of which is produced by the above production method.

Here, in the case of using the polyhydroxyimide as a photosensitive resin composition, when n indicating the polymerization degree of the polyimide in Formula (2) is larger than 1,000, the solubility of the resin composition in a general organic solvent is extremely lowered and the viscosity of the resin composition solution is remarkably enhanced, so that the handling properties of the resin composition solution may be impaired. Therefore, in consideration of the solubility, n is desirably a positive integer of 1 to 1,000, particularly desirably a positive integer of less than 100.

<(B) Component>

The type and the structure of the photoacid generator as the (B) component are not particularly limited so long as the photoacid generator has a function of enhancing the solubility of a light-irradiated portion of the resin composition in an alkaline developer by directly or indirectly generating an acid by being irradiated with light used for the exposure. In addition, the photoacid generators may be used individually or in combination of two or more types thereof.

As the photoacid generator as the (B) component, any one of the photoacid generators publicly known in the related art can be applied, and specific examples of the photoacid generator include o-quinonediazide compounds, allydiazonium salts, diallyiodonium salts, triallylsulfonium salts, o-nitrobenzyl esters, p-nitrobenzyl esters, trihalomethyl group-substituted s-triazine derivatives and imidesulfonate derivatives.

In addition, if necessary, a sensitizer can be used in combination with the photoacid generator as the (B) component. Examples of such a sensitizer include perylene, anthracene, thioxanthone, Michler's ketone, benzophenone and fluorene, to which the examples are not limited.

Among the photoacid generators as the (B) component, the o-quinonediazide compound is desired in terms of capability of obtaining high sensitivity and high resolution of a coating film obtained using the positive photosensitive resin composition.

The o-quinonediazide compound is usually obtained as an o-quinonediazidesulfonic acid ester or an o-quinonediazidesulfonamide, b subjecting o-quinonediazidesulfonyl chloride and a compound having at least one group selected from a hydroxy group and an amino group to a condensation reaction in the presence of a basic catalyst.

Examples of the o-quinonediazidesulfonic acid component constituting o-quinonediazidesulfonyl chloride include 1,2-naphthoquinone-2-diazide-4-sulfonic acid, 1,2-naphthoquinone-2-diazide-5-sulfonic acid and 1,2-naphthoquinone-2-diazide-6-sulfonic acid.

Specific examples of the compound having a hydroxy group include: phenol compounds such as phenol, o-cresol, m-cresol, p-cresol, hydroquinone, resorcinol, catechol, o-methoxyphenol, 4,4-isopropylidene diphenol, 1,1-bis(4-hydroxyphenyl)cyclohexane, 4,4'-dihydroxyphenylsulfone, 4,4-hexafluoroisopropylidene diphenol, 4,4',4"-trihydroxytriphenylmethane, 1,1,1-tris(4-hydroxyphenyl)ethane, 4,4'-[1-[4[1-(4-hydroxyphenyl)-1-methylethyl]phenyl]ethylidene]bisphenol, methyl 3,4,5-trihydroxybenzoate, propyl 3,4,5-trihydroxybenzoate, isoamyl 3,4,5-trihydroxybenzoic acid ester, 2-ethylbutyl 3,4,5-trihydroxybenzoic acid ester, 2,4-dihydroxybenzophenone, 2,3,4-trihydroxybenzophenone, 2,2',4,4'-tetrahydroxybenzophenone, 2,3,4,4'-tetrahydroxybenzophenone and 2,3,4,2',4'-pentahydroxybenzophenone; and aliphatic alcohols such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate and butyl lactate.

In addition, examples of the compound having an amino group include: anilines such as aniline, o-toluidine, m-toluidine, p-toluidine, 4-aminodiphenylmethane, 4-aminodiphenyl, o-phenylenediamine, m-phenylenediamine, p-phenylenediamine, 4,4'-diaminodiphenylmethane and 4,4'-diaminodiphenylether; and aminocyclohexane.

Further specific examples of the compound having both a hydroxy group and an amino group include: aminophenols such as o-aminophenol, m-aminophenol, p-aminophenol, 4-aminoresorcinol, 2,3-diaminophenol, 2,4-diaminophenol, 4,4'-diamino-4"-hydroxytriphenylmethane, 4-amino-4',4"-dihydroxytriphenylmethane, bis(4-amino-3-carboxy-5-hydroxyphenyl)ether, bis(4-amino-3-carboxy-5-hydroxyphenyl)methane, bis(4-amino-3-carboxy-5-hydroxyphenyl)sulfone, 2,2-bis(4-amino-3-carboxy-5-hydroxyphenyl)propane and 2,2-bis(4-amino-3-carboxy-5-hydroxyphenyl)hexafluoropropane; and alkanol amines such as 2-aminoethanol, 3-aminopropanol and 4-aminocyclohexanol.

By subjecting o-quinonediazidesulfonyl chloride and a compound having at least any one group selected from a hydroxy group and an amino group to a condensation reaction, there is obtained a di-substituted, tri-substituted, tetra-substituted or penta-substituted o-quinonediazide compound in which a part of or the whole of hydroxy groups or amino groups of the compound is substituted with o-quinonediazidesulfonyl groups of o-quinonediazidesulfonyl chloride. When such an o-quinonediazide compound is used as one component of a positive photosensitive resin composition, the above multi-substituted o-quinonediazide compound is generally used individually or in combination of two or more types of multi-substituted compounds selected from the above multi-substituted compounds.

From such a viewpoint that in a coating film obtained using a positive photosensitive resin composition, the balance of the solubilities in a developer between an exposed portion and an unexposed portion is advantageous and there is no development residue in a pattern bottom portion (residue in a pattern edge portion) during the development, among the above o-quinonediazide compounds, desired are o-quinonediazidesulfonic acid ester of p-cresol, o-quinonediazidesulfonic acid ester of 4,4'-[1-[4-[1-(4-hydroxyphenyl)-1-methylethyl]phenyl]ethylidene]bisphenol, o-quinonediazidesulfonic acid ester of methyl 3,4,5-trihydroxybenzoate, o-quinonediazidesulfonic acid ester of 2,3,4-trihydroxybenzophenone and o-quinonediazidesulfonic acid ester of 2,3,4,4'-tetrahydroxybenzophenone, and these compounds may be used individually or in combination of two or more types optionally selected from these compounds.

The content of the photoacid generator as the (B) component used in the present invention is 0.01 to 100 parts by mass, based on 100 parts by mass of the (A) component. In such a term that in the coating film obtained from the positive photosensitive resin composition of the present invention, the balance of the solubilities in a developer between an exposed portion and an unexposed portion becomes advantageous and further, from the viewpoint of the sensitivity of the coating film and the mechanical properties of a cured film obtained from the coating film, the content of the photoacid generator as the (B) component is desirably 50 parts by mass or less, more desirably 30 parts by mass or less.

<(C) Component>

As the (C) solvent used in the positive photosensitive resin composition of the present invention, in such terms that the solubility of the (A) component (a polyhydroxyimide of Formula (2) or a polyhydroxyimide having a unit structure of Formula (8)) in the solvent is high, that the compatibility of the solvent with the (B) component (photoacid generator) and with other components described below is advantageous, that the solvent is easily handled in the positive photosensitive resin composition, and that the solvent is a low-pollution organic solvent, an alkyl ester or an alcohol having 4 or more carbon atoms.

Among them, representative examples of such a solvent include butyl cellosolve, propylene glycol monomethyl ether, propylene glycol monomethyl ether acetate, dipropylene glycol monomethyl ether, γ-butyrolactone, n-butanol, sec-butanol, tert-butanol, methoxymethylpentanol, methylcellosolve, ethylcellosolve, methylcellosolve acetate, ethylcellosolve acetate, butyl carbitol, butyl carbitol acetate, ethyl carbitol, ethyl carbitol acetate, ethylene glycol monoisopropyl ether, ethylene glycol monobutyl ether, dipropylene glycol monoacetate monomethyl ether, dipropylene glycol monoethyl ether, dipropylene glycol monoacetate monoethyl ether, dipropylene glycol monopropyl ether, dipropylene glycol monoacetate monopropyl ether, 2-ethoxyethanol, 2-butoxyethanol, methyl lactate, ethyl lactate, butyl lactate, methyl acetate, ethyl acetate, n-butyl acetate, hexyl acetate, methyl 2-hydroxyisobutyrate, propylene glycol monoethyl ether acetate, methyl pyruvate, ethyl pyruvate, methyl 3-methoxypropionate, methylethyl 3-ethoxypropionate, ethyl 3-methoxypropionate, propyl 3-methoxypropionate, butyl 3-methoxypropionate and butyl butyrate. These solvents may be used in a solvent mixture of two or more types thereof.

Particularly from the viewpoint of being most easily handled in the positive photosensitive resin composition, it is desired to use one type or a mixture of two or more types selected from a group consisting of butylcellosolve, propylene glycol monomethyl ether, propylene glycol monomethyl ether acetate, dipropylene glycol monomethyl ether, methyl 2-hydroxyisobutyrate, γ-butyrolactone and butyl lactate. In addition, from the viewpoint of the preservation stability of the positive photosensitive resin composition, the solvent is desirably selected from a group consisting of propylene glycol monomethyl ether, propylene glycol monomethyl ether acetate, dipropylene glycol monomethyl ether, methyl 2-hydroxyisobutyrate and γ-butyrolactone, and from the viewpoint of photosensitive property, the solvent is desirably selected from a group consisting of propylene glycol monomethyl ether, propylene glycol monomethyl ether acetate, methyl 2-hydroxyisobutyrate and γ-butyrolactone.

Further, besides the above solvents, solvents such as acetone, methanol, ethanol, isopropylalcohol, dipentene, ethyl amyl ketone, methyl nonyl ketone, methyl ethyl ketone, methyl isoamyl ketone, methyl isopropyl ketone, ethylene glycol, ethylene glycol monoacetate, propylene glycol, diethylene glycol, diethylene glycol monoacetate, diethylene glycol dimethyl ether, 3-methyl-3-methoxybutyl acetate, tripropylene glycol methyl ether, 3-methyl-3-methoxybutanol, diisopropyl ether, ethyl isobutyl ether, diisobutylene, amyl acetate, butyl ether, diisobutyl ketone, methyl cyclohexene, propyl ether, dihexyl ether, dioxane, N,N-dimethyl acetamide, N,N-dimethylformamide, N-methyl-2-pyrrolidone, N-vinylpyrrolidone, dimethylsulfoxide, N-methylpyrrolidone, n-hexane, n-pentane, n-octane, 2-methoxy ethanol, diethyl ether, cyclohexanone, 3-ethoxypropionic acid, 3-methoxy propionic acid and diglyme may be used in a mixture of these solvents. However, from the viewpoint that these other solvents are used in a related-art positive photosensitive resin composition (they are not low-pollution organic solvents), it is better to use these solvents as little as possible, so that the ratio of these solvents in the whole solvent is preferably 5% by mass or less, more preferably 1% by mass or less.

<(D) Component>

The positive photosensitive resin composition of the present invention may contain a crosslinkable compound as the (D) component. The crosslinkable compound as the (D) component is not particularly limited, so long as the crosslinkable compound is a compound having a group capable of being reacted with an organic group contained in the polyhydroxyimide as the (A) component in a process (hereinafter, called as "during the final curing") for converting the coating film obtained using the positive photosensitive resin composition of the present invention into a cured film, and so long as the crosslinkable compound is a compound soluble in an alkaline developer in the developing process of the coating film obtained using the positive photosensitive resin composition.

Examples of such a crosslinkable compound (D) include: maleimide compounds; compounds having two or more epoxy groups; and melamine derivatives, benzoguanamine derivatives and glycoluril that have a group in which a hydrogen atom of an amino group is substituted with a methylol group, an alkoxymethyl group or, both of them, however, in the present invention, the maleimide compound is preferably used.

The structure of the maleimide compound is not particularly limited so long as a maleimide moiety is directly bonded to an aromatic ring and a hydrogen atom is directly bonded to an adjacent aromatic carbon.

Examples of the maleimide compound having a structure in which a maleimide moiety is directly bonded to an aromatic ring and a hydrogen atom is directly bonded to an adjacent aromatic carbon include compounds of Formula (11)

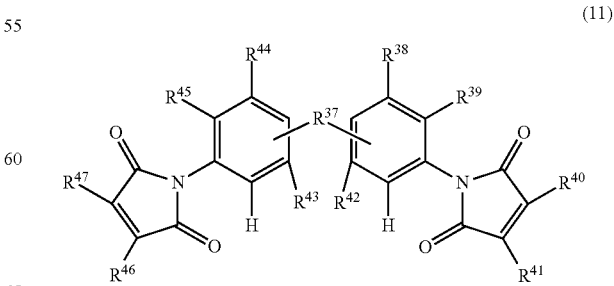

(11)

In Formula (11), $R^{37}$ is a divalent group, and $R^{38}$ to $R^{47}$ are independently a hydrogen atom or a $C_{1-12}$ organic group.

Among these maleimide compounds, a maleimide compound having a structure in which in Formula (11), $R^{37}$ is a structure of Formula (12) is desirably used as the (D) component.

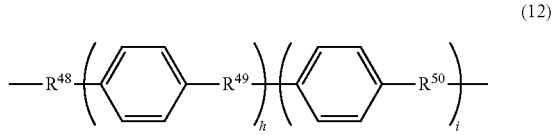

In Formula (12), h and i are independently 0 or 1, and $R^{48}$ to $R^{50}$ are independently a $C_{1-12}$ organic group or a divalent group having an oxygen atom, a sulfur atom or a nitrogen atom.

Particularly, desired is a maleimide compound in which in Formula (12), h and i are 1. $R^{48}$ and $R^{50}$ are an oxygen atom, and $R^{49}$ is a dimethylmethylene group.

Specific examples of the maleimide compound of Formula (11) include compounds such as 2,2-bis(3-amino-4-maleimide)hexafluoropropane, dimaleimide diphenyl ether, 3,4'-dimaleimide diphenyl ether, 3,3'-dimaleimide diphenyl ether, 4,4'-dimaleimidediphenylsulfide, 4,4'-dimaleimidediphenylmethane, 3,4'-dimaleimidediphenylmethane, 3,3'-dimaleimidediphenylmethane, 4,4-methylene-bis(2-methylmaleimide), 4,4'-dimaleimidediphenylsulfone, 3,3-dimaleimidediphenylsulfone, 1,4'-bis(4-maleimidephenoxy)benzene, 1,3'-bis(4-maleimidephenoxy)benzene, 1,3'-bis(4-maleimidephenoxy)benzene, bis[4-(4-maleimidephenoxy)phenyl]sulfone, bis[4-(3-maleimidephenoxy)phenyl]sulfone, bis[3-(4-maleimidephenoxy)phenyl]sulfone, bis[3-(3-maleimidephenoxy)phenyl]sulfone, 2,2'-bis[4-(4-maleimidephenoxy)phenyl]propane and 2,2-bis[4-(3-aminophenoxy)phenyl]propane, to which the examples are not limited.

Here, among the above compounds, in terms of easy availability, 4,4'-dimaleimidediphenylmethane and 2,2'-bis[4-(4-maleimidephenoxy)phenyl]propane are preferred and further, from the viewpoint of photosensitivity property, 2,2'-bis[4-(4-maleimidephenoxy)phenyl]propane is more preferred.

The maleimide compound used in the present invention as the (D) component may be used in combination of two or more types of maleimide compounds.

The content of the crosslinkable compound as the (D) component in the positive photosensitive resin composition of the present invention is not particularly limited. However, it is desirably 5 to 100 parts by mass, more desirably 5 to 20 parts by mass, based on 100 parts by mass of the polyhydroxyimide as the (A) component.

<Other Additives>

So long as the effect of the present invention is not impaired and if necessary, the positive photosensitive resin composition of the present invention may further contain surfactants, rheology controlling agents, adhesive assistants such as a silane coupling agent, pigments, dyes, preservation stabilizers, antifoamers or dissolution accelerators such as a polyphenol and a polycarboxylic acid.

Examples of the surfactant capable of being used for the purpose of enhancing the coating property of the positive photosensitive resin composition of the present invention include fluorinated surfactants, silicon-based surfactants and nonionic surfactants. For this type of surfactant, for example, a commercialized product manufactured by Sumitomo 3M Limited. Dainippon Ink and Chemicals, Inc., Asahi Glass Co., Ltd., or the like can be used. These commercialized products are useful because of their easy availability. Specific examples of the commercialized sufactant include a fluorinated surfactant such as: EFTOP EF301, EF303, and EF352 (manufactured by JEMCO Inc.); MEGAFAC F171, F173 and R-30 (manufactured by Dainippon Ink and Chemicals Inc.); Fluorad FC430 and FC431 (manufactured by Sumitomo 3M Limited); Asahi Guard AG 710, Surflon S-382, SC 101, SC 102, SC 103, SC 104, SC 105 and SC 106 (manufactured by Asahi Glass Co., Ltd.); and Ftergent series such as FTX-206D, FTX-212D, FTX-218, FTX-220D, FTX-230D, FTX-240D, FTX-212P, FTX-220P, FTX-228P and FTX-240G (manufactured by Neos Company Limited).

These surfactants may be used individually or in combination of two or more types thereof.

In addition, when a surfactant is used, the content of the surfactant in the positive photosensitive resin composition is usually 0.2% by mass or less, preferably 0.1% by mass or less, relative to 100% by mass of the positive photosensitive resin composition. When the used amount of the surfactant is set at an amount of more than 0.2% by mass, the enhancing effect on the coating property is impaired, which is noneconomic.

<Positive Photosensitive Resin Composition>

The positive photosensitive resin composition of the present invention is a composition that contains a polyhydroxyimide as the (A) component, a photoacid generator as the (B) component and the (C) solvent, and if desired, may further contain one or more type(s) of other additives such as a crosslinkable compound as the (D) component and a surfactant.

Among them, preferred examples of the positive photosensitive resin composition of the present invention include the following positive photosensitive resin compositions.

(1): A positive photosensitive resin composition containing 100 parts by mass of the (A) component and 0.01 to 100 parts by mass of the (B) component, both of which are dissolved in the (C) solvent.

(2): A positive photosensitive resin composition containing the content of the composition (1) and further 5 to 100 parts by mass of the (D) component, based on 100 parts by mass of the (A) component.

The ratio of the solid content in the positive photosensitive resin composition of the present invention is not particularly limited so long as each component is homogeneously dissolved in a solvent. However, generally, by preparing a solution of a positive photosensitive resin composition having a concentration of the positive photosensitive resin composition optionally selected from a range of 1 to 50% by mass as the solid content concentration, the coating film of the composition can be easily formed. Here, the solid content means a component remaining after subtracting the (C) solvent from the total component of the positive photosensitive resin composition.

The preparing method of the positive photosensitive resin composition of the present invention is not particularly limited. This type of composition is usually used in a form of a solution, so that general examples of the preparing method of the positive photosensitive resin composition of the present invention include: a method by dissolving the (A) component, the (B) component and if desired, the (D) component in the (C) solvent to prepare a homogeneous solution: and a method by further blending other additives to the mixture of the components of the above preparing method at an appropriate step of the above preparing method.

In addition, in the preparation of the positive photosensitive resin composition of the present invention, there can be used a reaction solution obtained during the production of the (A) component, that is, obtained by subjecting a component selected from a tetracarboxylic acid and a derivative of the tetracarboxylic acid, and a diamine component to a polymerization reaction in an organic solvent and to an imidization, as it is. Here, examples of the organic solvent to be used at this time include the solvents described in the above examples of the (C) solvent. Then, in this case, when the (B) component is charged into the reaction solution of the (A) component in substantially the same manner as that in the above preparing method to prepare a homogeneous solution, for the purpose of controlling the concentration, the (C) solvent may be further charged, and at this time, an organic solvent used in the production of the (A) component and a (C) solvent used for controlling the concentration may be the same as or different from each other.

In addition, when a plurality of types of organic solvents are used, the plurality of types of organic solvents may be mixed first, as well as optionally divided.

The thus prepared solution of the positive photosensitive resin composition is preferably filtered using a filter having a pore diameter of around 0.2 µm to be used.

<Coating Film and Cured Film>

Generally, for example, by a method including: applying the positive photosensitive resin composition of the present invention on an ITO substrate, a silicon wafer, a glass plate, a ceramics substrate or a substrate having an oxide film, a nitride film or the like by a publicly known method such as spin coating, immersion and printing: and predrying the composition at 60° C. to 160° C., desirably 70° C. to 130° C., a coating film produced from the positive photosensitive resin composition of the present invention can be formed.

After the formation of the coating film, by exposing the coating film to, for example an ultraviolet ray using a mask having a predetermined pattern and by developing the coating film with an alkaline developer, an exposed portion is cleaning-removed and consequently, a relief pattern having a sharp edge face is formed on a substrate.

The alkaline developer used here is not particularly limited so long as the alkaline developer is an alkaline aqueous solution and examples of the alkaline developer include: an aqueous solution of an alkali metal hydroxide such as potassium hydroxide, sodium hydroxide, potassium carbonate and sodium carbonate; an aqueous solution of a quaternary ammonium hydroxide such as tetramethyl ammonium hydroxide, tetraethyl ammonium hydroxide and choline; and an aqueous solution of an amine such as ethanolamine, propylamine and ethylenediamine.

The concentration of the alkaline developer is generally 10% by mass or less, and industrially used is an alkaline aqueous solution having a concentration of 0.1 to 3.0% by mass. In addition, the alkaline developer may contain alcohols, surfactants or the like, each of which is desirably contained in a content of around 0.05 to 10% by mass.

In the development process, the temperature of the alkaline developer can be optionally selected. However, when the positive photosensitive resin composition of the present invention is used, the solubility of an exposed portion is high, so that the development with an alkaline developer can be easily performed at room temperature.

By subjecting a substrate having the thus obtained relief pattern to thermal treatment (baking) at a temperature of 180° C. to 400° C., it is possible to obtain a cured film with a relief pattern, which has low water-absorbency and consequently excellent electric property, advantageous heat resistance, and advantageous chemical resistance.

The cured film obtained from the positive photosensitive resin composition of the present invention has such excellent effects, so that the cured film can be used for electric and electronic devices, semiconductor devices, display devices and the like. Particularly, the cured film obtained from the positive photosensitive resin composition of the present invention has such a characteristic effect as having high reliability of the organic EL element (one type of light-emitting diode (LED) element), so that the cured film is extremely useful either as an insulating film and a diaphragm material for the organic EL element having a large problem of damage of a light emitting element, or for a buffer coating in which an ion migration of a copper wiring is largely influenced by the water absorbency of an insulating film in a semiconductor package.

EXAMPLES

Hereinafter, the present invention will be further described in more detail referring to Examples which should not be construed as limiting the scope of the present invention.

ABBREVIATION USED IN EXAMPLES

The meanings of the abbreviations used in the following Examples are as follows.

[Solvent]
NMP: N-methyl-2-pyrrolidone
PGME: propylene glycol monomethyl ether
PGMEA: propylene glycol monomethyl ether acetate
HBM: methyl 2-hydroxyisobutyrate
GBL: γ-butyrolactone
[Amines]
BAHF: 2,2'-bis(3-amino-4-hydroxyphenyl)hexafluoropropane
BABHBPA: bis-N,N'-(p-aminobenzoyl)-hexafluoro-2,2'-bis(4-hydroxyphenyl)propane
APDS: bis(3-aminopropyl)-1,1,3,3-tetramethyldisiloxane
ODA: 4,4'-diamino diphenyl ether
[Acid Dianhydride]
SSDA: 3,3',4,4'-diphenylsulfone tetracarboxylic anhydride
ODPA: 3,3',4,4'-diphenyl ether tetracarboxylic anhydride
CBDA: cyclobutane tetracarboxylic anhydride
[Acid Component to be Added]
AcOH: acetic acid
TFAOH: trifluoroacetic acid
[Photoacid Generator]
P200: manufactured by Toyo Gosei Co., Ltd. P-200 (trade name): a sensitizer synthesized according to a condensation reaction between 1 mol of 4,4'-[1-[4-[1-(4-hydroxyphenyl)-1-methylethyl]phenyl]ethylidene]bisphenol and 2 mol of 1,2-naphthoquinone-2-diazide-5-sulfonyl chloride.
[Crosslinkable Compound]
BMI-80: 2,2'-bis[4-(4-maleimidephenoxy)phenyl]propane
[Surfactant]
MEGAFAC R-30 (manufactured by Dainippon Ink and Chemicals, Inc.)
FTX-212D (manufactured by Neos Company Limited)
<Measurement of Number Average Molecular Weight and Weight Average Molecular Weight>

The weight average molecular weight (hereinafter, abbreviated as Mw) and the molecular weight distribution of the polymer were measured by a GPC apparatus (manufactured by JASCO Corporation; Shodex (registered trademark) columns KF803L and KF805L) using dimethylformamide as an eluting solvent under the conditions: flow rate of 1 mL/min. and column temperature of 50° C. Here, Mw is a value converted into that of polystyrene.

<Measurement of Imidization Rate>

The imidization rate was measured by measuring H-NMR (JNM-LA series; manufactured by JEOL Ltd.) and by calculating the imidization rate from a proton ratio of an aromatic moiety of a polymer skeleton, a proton ratio of an NH moiety of a polyamic acid and a proton ratio of a hydroxy group. Here, as the deuterated solvent, dimethylsulfoxide was used. In addition, the integration times were 64 times and the imidization rate was measured two times to calculate the imidization rate as an average value of two measured values.

Example 1

Synthesis of Polyhydroxyimide 15.2 g (0.041 mol) of BAHT was dissolved in 70 g of NMP, and to the resultant solution, 18.8 g (0.041 mol) of DSDA was added, followed by effecting the reaction at room temperature for 24 hours to synthesize a polyhydroxyamic acid solution.

To this solution, 30 g of AcOH as an acid component was added and the resultant reaction mixture was heated at 60° C. for 20 hours. Subsequently, the reaction mixture was charged into 200 g of a 50 wt % methanol aqueous solution and a deposited precipitation was filtered off, followed by drying the precipitation in a vacuum oven (at 60° C. for 18 hours). The yield of the obtained polymer was 29.4 g (yield: 98.5%).

In addition, the imidization rate was 92% and a hydroxy group was confirmed.

Example 2 to Example 7

Synthesis of Polyhydroxyimide

A polyhydroxyamic acid was synthesized using an acid dianhydride and an amine compound shown in Table 1 in substantially the same manner as that in Example 1. To the synthesized polyhydroxyamic acid, an acid component was added and the resultant reaction mixture was heated at a temperature shown in Table 1 for 20 hours, followed by producing and recovering a poly hydroxyimide in substantially the same manner as that in Example 1

The type and the amount of the used acid dianhydride, amine, solvent and acid component, the heating temperature, and the measuring results of the yield, molecular weight and imidization rate are shown in Table 1.

Comparative Example 1

9.31 g (0.025 mol) of BAHF and 0.702 g (0.003 mol) of APDS were dissolved in 70 g of NMP, and to the resultant solution, 4.98 g (0.025 mol) of CBDA was added, followed by effecting the reaction at room temperature for 24 hours to synthesize a polyhydroxyamic acid solution.

To this solution, 30 g of AcOH was added, and the resultant reaction mixture was heated at 40° C. for 20 hours. Subsequently, the reaction mixture was charged into 200 g of a 50 w % methanol aqueous solution and a deposited precipitation was filtered off, followed by drying the precipitation in a vacuum oven (at 60° C. for 18 hours). The imidization rate of the obtained polymer was measured and found to be 3%.

Comparative Example 2

14.6 g (0.040 mol) of BAHF and 1.10 g (0.004 mol) of APDS were dissolved in 70 g of NMP, and to the resultant solution, 14.2 g (0.040 mol) of DSDA was added, followed by effecting the reaction at room temperature for 24 hours to synthesize a polyhydroxyamic acid solution.

To this solution, 200 g of NMP was added, and further 45.2 g (0.440 mol) of acetic anhydride and 21.0 g (0.254 mol) of pyridine were added, followed by heating the resultant reaction mixture at 40° C. for 4 hours. Subsequently, the reaction mixture was charged into 2,100 g of a 50 wt % methanol aqueous solution and a deposited precipitation was filtered off, followed by drying the precipitation in a vacuum oven (at 40° C. for 18 hours). The imidization rate of the obtained polymer was measured and found to be 92%. However, all hydroxy groups were acetoxylated.

As described above, in Examples 1 to 7, by the use of acetic acid and under such a moderate condition as heating at 50 to 80° C. for 20 hours, a polyhydroxyimide having an imidization rate of around 90% could be synthesized.

On the contrary, in Comparative Example 1 in which the imidization was performed under a condition of a temperature (40° C.) lower than those in Examples, the polymer was hardly imidized. In addition, in Comparative Example 2 using an imidization method of the related art using acetic anhydride and a basic solvent, though the imidization rate was high, hydroxy groups were acetoxylated.

TABLE 1

Polymer composition, synthesis conditions and properties of obtained polymer

| Examples | Polymer composition (g) | | | | NMP used amount (g) | Acid component (g) | Heating temp. (° C.) | Yield (%) | Molecular weight (Mw) | Imidization rate (%) |
| --- | --- | --- | --- | --- | --- | --- | --- | --- | --- | --- |
| | Acid dianhydride | Amine 1 | Amine 2 | Amine 3 | | | | | | |
| 1 | DSDA 14.8 | BAHF 15.2 | — | — | 70.0 | AcOH 30.0 | 60 | 98.5 | 11,000 | 92 |
| 2 | DSDA 14.3 | BAHF 14.6 | APDS 1.10 | — | 70.0 | AcOH 30.0 | 50 | 96.3 | 11,000 | 92 |
| 3 | DSDA 14.3 | BAHF 14.6 | APDS 1.10 | — | 70.0 | AcOH 15.0 | 80 | 97.7 | 9,000 | 88 |
| 4 | DSDA 14.3 | BAHF 14.6 | APDS 1.10 | — | 70.0 | TFAOH 3.0 | 80 | 98.8 | 8,000 | 88 |
| 5 | DSDA 14.5 | BAHF 13.2 | APDS 1.10 | ODA 0.901 | 70.0 | AcOH 30.0 | 80 | 99.5 | 10,000 | 89 |
| 6 | CBDA 4.98 | BAHF 9.31 | APDS 0.702 | — | 70.0 | AcOH 30.0 | 80 | 89.5 | 16,000 | 92 |
| 7 | ODPA 5.06 | BABHBPA 9.85 | — | — | 85.0 | AcOH 15.0 | 80 | 93.5 | 7,800 | 88 |

Example 8 to Example 18, Comparative Example 3 and Comparative Example 4

Production of Positive Photosensitive Resin Composition

By a method including: using the polymers obtained in Examples and Comparative Examples; mixing the (A) component (polymer), the (B) component (photoacid generator), the (C) component (solvent) and further, the (D) component (crosslinkable compound) and a fluorinated surfactant each in a predetermined ratio according to a composition shown in Table 2; and stirring the resultant reaction mixture at room temperature for 3 hours or more to prepare a homogeneous solution, a positive photosensitive resin composition of each of Examples and Comparative Examples was prepared.

<1. Film Thickness Before Development>

The positive photosensitive resin composition was applied on an ITO substrate (manufactured by Sanyo Vacuum Industries Co., Ltd.) having a step of 25 mm×25 mm using a spin coater and was pre-baked on a hot plate at a temperature of 100° C. for 120 seconds to form a coating film. Here, the film thickness was measured using a contact film thickness meter (trade name: Dektak 3ST; manufactured by ULVAC. Inc.)

<2. Film Thickness after Development, Resolution (Line Width)>

The obtained coating, film was irradiated with ultraviolet light from an ultraviolet ray irradiating apparatus (trade name: PLA-501; manufactured by Canon Inc.) through masks having a line/space of 1, 2, 3, 4, 5, 6, 7, 8, 9, 20, 30, 40, 50, 70, 90 and 100 μm for 30 seconds (200 mJ/cm$^2$). After the exposure, the coating film was immersed in a tetramethylam-

TABLE 2

Composition of positive photosensitive resin composition

| No. | (A) component (g) | (B) component (g) | (C) component (g) | (D) component (g) | Surfactant (g) |
| --- | --- | --- | --- | --- | --- |
| Example 8 | Example 1 3.0 | P200 0.9 | PGME 15.4 | — | R-30 0.0002 |
| Example 9 | Example 2 3.0 | P200 0.9 | PGME 15.4 | — | R-30 0.0002 |
| Example 10 | Example 3 3.0 | P200 0.9 | PGME 15.4 | — | FTX-212D 0.0002 |
| Example 11 | Example 4 3.0 | P200 0.9 | PGME 15.4 | — | FTX-212D 0.0002 |
| Example 12 | Example 5 3.0 | P200 0.9 | PGME 15.4 | — | R-30 0.0002 |
| Example 13 | Example 3 3.0 | P200 0.9 | PGMEA 15.4 | — | FTX-212D 0.0002 |
| Example 14 | Example 3 3.0 | P200 0.9 | HBM 18.7 | — | FTX-212D 0.0002 |
| Example 15 | Example 6 3.0 | P200 1.5 | PGME 14.6 | — | R-30 0.0002 |
| Example 16 | Example 7 3.0 | P200 1.5 | PGME 18.7 | — | R-30 0.0002 |
| Example 17 | Example 3 3.0 | P200 0.9 | PGMEA/GBL 9.75/6.77 | BMI-80 0.6 | FTX-212D 0.0002 |
| Example 18 | Example 6 3.0 | P200 0.9 | PGME/GBL 9.75/6.77 | BMI-80 0.6 | FTX-212D 0.0002 |
| Comparative Example 3 | Comparative Example 1 3.0 | P200 1.5 | PGME 18.0 | — | — |
| Comparative Example 4 | Comparative Example 2 3.0 | P200 0.9 | PGME 15.4 | — | — |

Evaluation of Photosensitivity Property

Examples 8 to 18, Comparative Examples 3 and 4

The photosensitivity property of each of the positive photosensitive resin compositions obtained in Examples 8 to 18 and Comparative Examples 3 and 4 was evaluated by the following methods. The obtained results are shown in Table 3.

monium hydroxide aqueous solution (2.38% by mass) of 23° C. for 30 seconds to develop a pattern and the film thickness after the development was measured.

In addition, the coating film after the development was observed under an optical microscope and the minimum line width with which a line/space was formed without the peeling of the pattern was measured as the resolution.

TABLE 3

Evaluation result of photosensitivity property

| No. | Film thickness before development (μm) | Film thickness after development (μm) | Changed amount of film thickness (μm) | Resolution (μm) |
| --- | --- | --- | --- | --- |
| Example 8 | 2.0 | 1.6 | 0.4 | 9 |
| Example 9 | 2.0 | 1.8 | 0.2 | 6 |
| Example 10 | 1.9 | 1.7 | 0.2 | 4 |
| Example 11 | 1.9 | 1.5 | 0.4 | 8 |

TABLE 3-continued

Evaluation result of photosensitivity property

| No. | Film thickness before development (μm) | Film thickness after development (μm) | Changed amount of film thickness (μm) | Resolution (μm) |
|---|---|---|---|---|
| Example 12 | 1.7 | 1.4 | 0.3 | 8 |
| Example 13 | 1.9 | 1.8 | 0.1 | 4 |
| Example 14 | 1.9 | 1.8 | 0.1 | 4 |
| Example 15 | 3.0 | 2.0 | 1.0 | 10 |
| Example 16 | 1.8 | 1.3 | 0.6 | 10 |
| Example 17 | 1.6 | 1.55 | 0.05 | 4 |
| Example 18 | 2.0 | 1.5 | 0.5 | 8 |
| Comparative Example 3 | 3.0 | 0 | 3.0 | — |
| Comparative Example 4 | 2.0 | 2.0 | 0.0 | — |

As shown in Table 3, the cured films obtained from the positive photosensitive resin compositions of Examples 8 to 18 had a small film loss at an unexposed portion and on the cured films, a positive pattern with a resolution of 10 μm or less was obtained.

On the contrary, the cured film of Comparative Example 3 was entirely dissolved in a developer, and on the cured film of Comparative Example 4, no positive pattern could be obtained.

INDUSTRIAL APPLICABILITY

As described above, the present invention is characterized by improving such problems in a production method of a polyhydroxyimide in the related art that a high-temperature heating process and a cumbersome production process are required.

According to the production method of a polyhydroxyimide of the present invention, by using a weak acid such as acetic acid, a polyhydroxyimide can be produced under a temperature condition of 10° C. or less without converting a hydroxy group into an acetoxy group, that is, without deactivating a developing group (a hydroxy group) necessary for, for example, utilizing the polyhydroxyimide as a photosensitive resin.

Accordingly, the polyhydroxyimide obtained by the present invention is excellent in electric insulation, heat resistance, mechanical strength and electric properties which are the characteristics of an imide-based resin. Besides, the polyhydroxyimide obtained by the present invention enables production of a cured film excellent in sensitivity and resolution important for a photosensitive resin composition. In other words, the polyhydroxyimide can be applied to a production of a cured film capable of forming a high-resolution circuit pattern.

Accordingly, the polyhydroxyimide of the present invention is suitable for a material for forming a cured film such as a protective film, a planarizing film and an insulating film in various displays such as a thin-film transistor liquid crystal display element and an organic EL element, particularly for a material for forming an interlayer insulating film for a TFT liquid crystal element, a color filter, an array planarizing film, a concavo-convex film as an underlayer of a reflecting film in a reflection-type display and an insulating film for an organic EL element.

Further, as described above, the production method of the present invention can produce a polyhydroxyimide from a polyhydroxyamic acid in one step and the simplification of the production process and the reduction of the cost can be expected to be achieved from the production method of the present invention in comparison with a related-art production method. Thus, the production method of the present invention can be utilized as an excellent industrial production method.

The invention claimed is:

1. A production method of a polyhydroxyimide, comprising:

adding an acid component that is at least one type of carboxylic acid having a pKa of 0 to 5 to a polyhydroxyimide precursor of Formula (1):

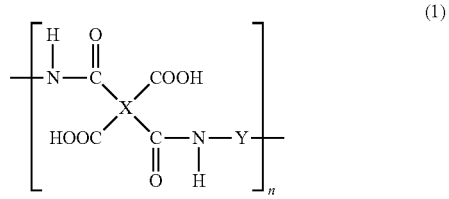

(1)

wherein X is a tetravalent aliphatic or aromatic group,
Y is an organic group containing an aromatic group substituted with at least one OH group, and
n is an integer of 1 or more; and heating the resultant mixture to a temperature of 50 to 100° C. to prepare a polyimide of Formula (2):

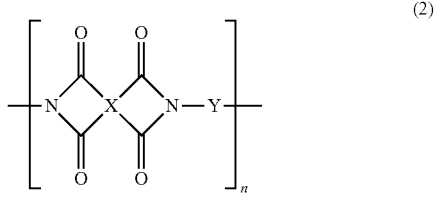

(2)

wherein X, Y and n are the same as those defined above
the polyhydroxyimide has a weight average molecular weight of 3,000 to 100,000 and
the polyhydroxyimide has an imidization rate of 85% or more.

2. The production method of a polyhydroxyimide according to claim 1, wherein Y is an organic group containing a benzene ring substituted with at least one OH group.

3. The production method of a polyhydroxyimide according to claim 2, wherein Y is an organic group containing two or more benzene rings substituted with at least one OH group.

4. The production method of a polyhydroxyimide according to claim 3, wherein Y contains at least one type of structure selected from the structures of Formula (3) to Formula (5):

  (3)

  (4)

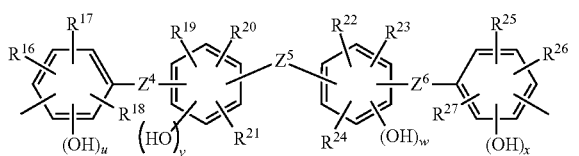  (5)

wherein $R^1$ to $R^{27}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxyl group, a phospho group, a sulfo group, a phenyl group which is optionally substituted with W, a naphthyl group which is optionally substituted with W, a thienyl group which is optionally substituted with W or a furyl group which is optionally substituted with W, W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phospho group or a sulfo group, $Z^1$ to $Z^6$ are a single bond, a $C_{1-10}$ alkylene group which is optionally substituted with $W^1$, —C(O)O—, —C(O)NH—, —O—, —S—, —S(O)$_2$— or —C(O)—, $W^1$ is a $C_{1-10}$ alkyl group, a $C_{1-10}$ haloalkyl group or a $C_{1-10}$ alkoxy group, and p to x are an integer of 1 or more and satisfy $2 \geq p+q \geq 1$, $2 \geq r+s+t \geq 1$ and $2 \geq u+v+w+x \geq 1$.

5. The production method of a polyhydroxyimide according to claim 4, wherein $Z^1$ to $Z^6$ are a single bond, —CH$_2$—, —C(CH$_3$)$_2$—, —C(CF$_3$)$_2$—, —C(O)NH—, —O—, —S(O)$_2$— or —C(O)—.

6. The production method of a polyhydroxyimide according to claim 1, wherein the carboxylic acid is a carboxylic acid of Formula (6):

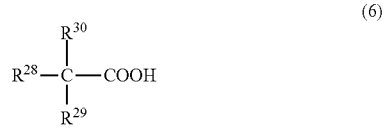  (6)

wherein $R^{28}$ to $R^{30}$ are independently a hydrogen atom, a $C_{1-5}$ alkyl group, a $C_{1-5}$ haloalkyl group, a halogen atom, a nitro group, a phenyl group which is optionally substituted with $W^2$, a naphthyl group which is optionally substituted with $W^2$, a thienyl group which is optionally substituted with $W^2$ or a furyl group which is optionally substituted with $W^2$, and $W^2$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phospho group or a sulfo group.

7. The production method of a polyhydroxyimide according to claim 6, wherein the carboxylic acid of Formula (6) is a $C_{1-6}$ aliphatic carboxylic acid.

8. The production method of a polyhydroxyimide according to claim 7, wherein in Formula (6), $R^{28}$ to $R^{30}$ are a hydrogen atom or a halogen atom.

9. The production method of a polyhydroxyimide according to claim 8, wherein the carboxylic acid of Formula (6) is acetic acid or trifluoroacetic acid.

10. The production method of a polyhydroxyimide according to claim 1, wherein the acid component is added in a mass 0.1 to 2 times the mass of the polyhydroxyimide precursor of Formula (1).

11. The production method of a polyhydroxyimide according to claim 1, wherein the heating temperature is 50 to 80° C.

12. A production method of a polyhydroxyimide, comprising:

adding an acid component that is at least one type of carboxylic acid having a pKa of 0 to 5 to a polyhydroxyimide precursor having a unit structure of Formula (7):

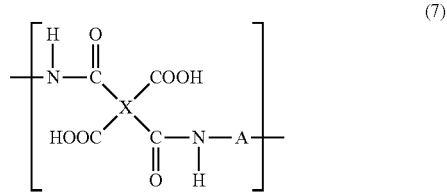  (7)

wherein X is a tetravalent aliphatic or aromatic group,

A is either an organic group containing an aromatic group substituted with at least one OH group or a group of Formula (9):

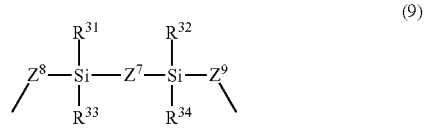  (9)

wherein $R^{31}$ to $R^{34}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxyl group, a phospho group, a sulfo group, a phenyl group which is optionally substituted with $W^3$, a naphthyl group which is optionally substituted with $W^3$, a thienyl group which is optionally substituted with $W^3$ or a furyl group which is optionally substituted with $W^3$, $W^3$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phospho group or a sulfo group, $Z^7$ to $Z^9$ are independently a single bond, a $C_{1-10}$ alkylene group which is optionally substituted with $W^4$, —C(O)

O—, —C(O)NH—, —O—, —S—, —S(O)$_2$— or —C(O)—, and W$^4$ is a C$_{1-10}$ alkyl group, a C$_{1-10}$ haloalkyl group or a C$_{1-10}$ alkoxy group, with proviso that the polyhydroxyimide precursor contains a unit structure containing the organic group containing an aromatic group substituted with at least one OH group and a unit structure containing the group of Formula (9); and heating the resultant mixture to a temperature of 50 to 100° C. to prepare a polyimide of Formula (8):

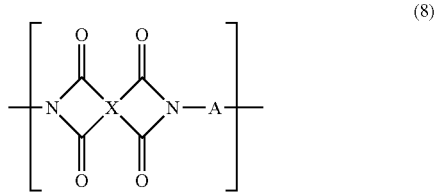

wherein X and A are the same as those defined above,
the polyhydroxyimide has a weight average molecular weight of 3,000 to 100,000, and
the polyhydroxyimide has an imidization rate of 85% or more.

13. The production method of a polyhydroxyimide according to claim 12, wherein the organic group as A containing an aromatic group substituted with at least one OH group is an organic group containing a benzene ring substituted with at least one OH group.

14. The production method of a polyhydroxyimide according to claim 13, wherein the organic group as A containing an aromatic group substituted with at least one OH group is an organic group containing two or more benzene rings substituted with at least one OH group.

15. The production method of a polyhydroxyimide according to claim 14, wherein the organic group as A containing an aromatic group substituted with at least one OH group is an organic group containing at least one type of structure selected from structures of Formula (3) to Formula (5):

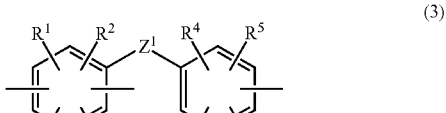

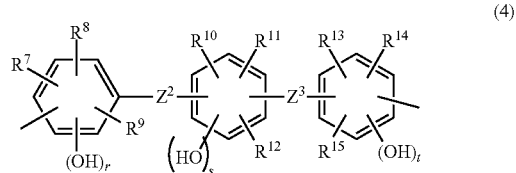

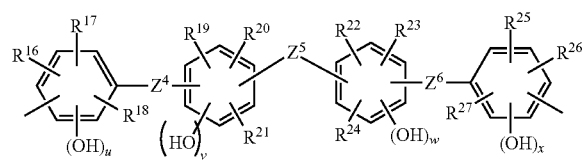

wherein R$^1$ to R$^{27}$ are independently a hydrogen atom, a C$_{1-10}$ alkyl group, a C$_{1-10}$ haloalkyl group, a C$_{1-10}$ alkoxy group, a halogen atom, a nitro group, a formyl group, a cyano group, a carboxyl group, a phospho group, a sulfo group, a phenyl group which is optionally substituted with W, a naphthyl group which is optionally substituted with W, a thienyl group which is optionally substituted with W or a furyl group which is optionally substituted with W, W is a C$_{1-10}$ alkyl group, a C$_{1-10}$ haloalkyl group, a C$_{1-10}$ alkoxy group, a hydroxy group, a halogen atom, a nitro group, a formyl group, a cyano group, a carboxyl group, a phospho group or a sulfo group, Z$^1$ to Z$^6$ are a single bond, a C$_{1-10}$ alkylene group which is optionally substituted with W$^1$, —C(O)O—, —C(O)NH—, —O—, —S—, —S(O)$_2$— or —C(O)—, W$^1$ is a C$_{1-10}$ alkyl group, a C$_{1-10}$ haloalkyl group or a C$_{1-10}$ alkoxy group, and p to x are an integer of 1 or more and satisfy 2≥p+q≥1, 2≥r+s+t≥1 and 2≥u+v+w+x≥1.

16. The production method of a polyhydroxyimide according to claim 15, wherein Z$^1$ to Z$^6$ are a single bond, —CH$_2$—, —C(CH$_3$)$_2$—, —C(CF$_3$)$_2$—, —C(O)NH—, —O—, —S(O)$_2$— or —C(O)—.

17. The production method of a polyhydroxyimide according to claim 12, wherein in Formula (9), R$^{31}$ to R$^{34}$ are a methyl group, Z$^7$ is —O—, and Z$^8$ and Z$^9$ are a propylene group.

18. The production method of a polyhydroxyimide according to claim 12, wherein the carboxylic acid is a carboxylic acid of Formula (6):

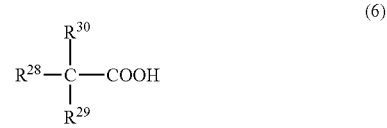

wherein R$^{28}$ to R$^{30}$ are independently a hydrogen atom, a C$_{1-5}$ alkyl group, a C$_{1-5}$ haloalkyl group, a halogen atom, a nitro group, a phenyl group which is optionally substituted with W$^2$, a naphthyl group which is optionally substituted with W$^2$, a thienyl group which is optionally substituted with W$^2$ or a furyl group which is optionally substituted with W$^2$, and W$^2$ is a C$_{1-10}$ alkyl group, a C$_{1-10}$ haloalkyl group, a C$_{1-10}$ alkoxy group, a hydroxy group, a halogen atom, a nitro group, a formyl group, a cyano group, a carboxyl group, a phospho group or a sulfo group.

19. The production method of a polyhydroxyimide according to claim 18, wherein the carboxylic acid of Formula (6) is a C$_{1-6}$ aliphatic carboxylic acid.

20. The production method of a polyhydroxyimide according to claim 19, wherein in Formula (6), R$^{28}$ to R$^{30}$ are a hydrogen atom or a halogen atom.

21. The production method of a polyhydroxyimide according to claim 20, wherein the carboxylic acid of Formula (6) is acetic acid or trifluoroacetic acid.

22. The production method of a polyhydroxyimide according to claim 12, wherein the acid component is added in a mass 0.1 to 2 times the mass of the polyhydroxyimide precursor having a unit structure of Formula (7).

23. The production method of a polyhydroxyimide according to claim 12, wherein the heating temperature is 50 to 80° C.

* * * * *